US005508635A

United States Patent [19]
Kwon

[11] Patent Number: 5,508,635
[45] Date of Patent: Apr. 16, 1996

[54] REDUCED NOISE DATA OUTPUT BUFFER WITH OUTPUT LEVEL REGULATION

[75] Inventor: Jung T. Kwon, Seoul, Rep. of Korea

[73] Assignee: Hyundai Electronics Industries Co., Ltd., Rep. of Korea

[21] Appl. No.: 383,005

[22] Filed: Feb. 3, 1995

[30] Foreign Application Priority Data

Feb. 7, 1994 [KR] Rep. of Korea .................. 94-2244

[51] Int. Cl.⁶ ............................................. H03K 17/16
[52] U.S. Cl. ........................... 326/27; 326/82; 326/87
[58] Field of Search ..................... 326/26–28, 82–83, 326/86–87

[56] References Cited

U.S. PATENT DOCUMENTS

| | | | |
|---|---|---|---|
| 4,857,765 | 8/1989 | Cahill et al. | 326/26 |
| 5,121,013 | 6/1992 | Chuang et al. | 326/26 |
| 5,184,033 | 2/1993 | Chiao et al. | |
| 5,248,906 | 9/1993 | Mahmood. | |
| 5,367,210 | 11/1994 | Lipp | 326/26 |
| 5,391,939 | 2/1995 | Nonaka | 326/26 X |
| 5,430,389 | 7/1995 | Kamiya | 326/27 |
| 5,434,519 | 7/1995 | Trinh et al. | 326/83 |
| 5,438,545 | 8/1995 | Sim | 326/27 X |
| 5,440,258 | 8/1995 | Galbi et al. | 327/112 |

*Primary Examiner*—David R. Hudspeth
*Attorney, Agent, or Firm*—Fish & Richardson

[57] ABSTRACT

A data output buffer in a semiconductor device is disclosed. A data output buffer can decrease noise generated in a power line when the output data is inverted, by equalizing the output voltage of the output buffer to a reference voltage when the output buffer outputs a "HIGH" potential voltage to constantly maintain the output voltage regardless of variation in the operating voltage of the output buffer.

5 Claims, 2 Drawing Sheets

REDUCED NOISE DATA OUTPUT BUFFER WITH OUTPUT LEVEL REGULATION

FIELD OF THE INVENTION

This invention relates to a data output buffer in a semiconductor device, and particularly to a data output buffer in a semiconductor device which can reduce noise generated in a power line when an output data is inverted, by equalizing the output voltage of the output buffer to a reference voltage when the output buffer outputs high potential level voltage to constantly maintain the output voltage regardless of variation in the operating voltage of the output buffer.

INFORMATION DISCLOSURE STATEMENT

Generally, a data output buffer outputs a data read from a memory cell to an output terminal upon the input of an output enable signal. If the operating voltage of the output buffer is increased, the output voltage thereof is increased. The charge current or discharge current followed through a pull-up transistor or a pull-down transistor is increased when output voltage of the data output buffer is changed to a low potential level from a high potential level or to a high potential level from a low potential level. Accordingly, noise is generated on power lines, thereby causing various operational errors.

SUMMARY OF THE INVENTION

Therefore, it is an object of the present invention to provide a data output buffer to solve the noise problem.

It is an another object of the present invention to provide a data output buffer which can maintain constant output voltage regardless of variation in the operating voltage of the output buffer by equalizing the output voltage in the output buffer to a reference voltage when the output buffer outputs high potential voltage.

A data output buffer in a semiconductor device comprising: a latch circuit 5 outputting a first, second and third latch signal in response to an output enable signal and an input signal; a pull-down transistor Q12 activated by the third latch signal of the latch circuit 5; a delay circuit 3 to delay the second latch signal of the latch circuit 5; a first switching circuit 7 switched on in response to an output signal of the delay circuit 3; a second switching circuit 8 connected to the first switching circuit 7 and switched on in response to the second latch signal of the latch circuit 5 ; a control circuit 6 activated by the first latch signal and the operation of the first and second switching circuits 7 and 8; a reference voltage generator 4 for generating a constant reference voltage; a voltage comparator 1 activated by an output signal of the control circuit 6 and compared the output voltage of the data output buffer 100 with the output voltage of the reference voltage generator 4, thereby outputting a compared signal to the control circuit 6; a pull-up transistor Q11 activated in response to another output signal of the control circuit 6 and connected to the pull-down transistor Q12 via an output terminal; and a voltage regulator 2 activated by the second latch signal of the latch circuit 5 and connected to the output terminal, and the reference voltage generator 4.

The voltage comparator 1 is comprised of a differential amplifier connected between a voltage supply source and the ground, a transistor Q6 connected to the voltage supply source and activated by the operation of the differential amplifier, and a current source I connected between the transistor Q6 and the ground. The delay circuit 3 is comprised of a plurality of inverters.

The voltage regulator 2 comprises a differential amplifier connected between a voltage supply source and the ground, a transistor Q16 connected between an output terminal of the differential amplifier and the voltage supply source, and a transistor Q13 connected between the voltage supply source and the data output terminal, with the transistor Q13 activating in response to the output voltage of the differential amplifier.

The control circuit 6 is comprised of: a first transistor Q8 connected between the voltage comparator and the ground, and turned off in response to the second latch signal; a second transistor Q7 connected between a voltage supply source and the first switching circuit 7 and activated by the operation of the first transistor Q8; a first inverter G11 connected between the first switching circuit 7 and the first transistor Q8; and a second inverter G12 connected between the first inverter G11 and the pull-up transistor Q11.

BRIEF DESCRIPTION OF THE DRAWINGS

For a fuller understanding of the nature and the objective of the invention, reference should be made to the following detailed description in conjunction with the accompanying drawings in which.

Similar references characters refer to similar parts through the several view of the drawings.

DETAILED DESCRIPTION OF THE INVENTION

Figure 1:
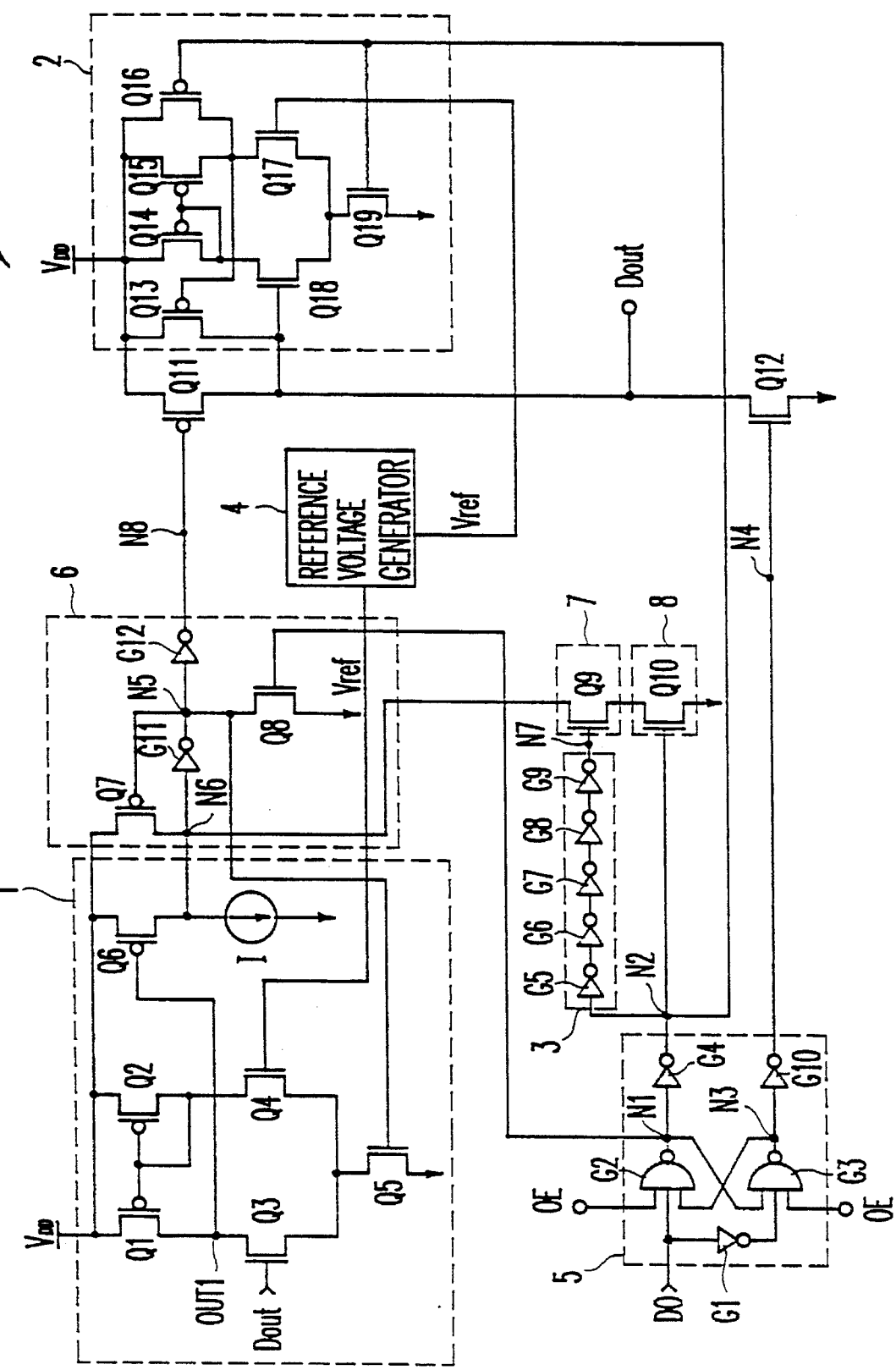
FIG. 1 is a detailed circuit of a data output buffer in a semiconductor device according to the present invention.

FIG. 1 is a detailed circuit of a data output buffer in a semiconductor device according to the present invention.

When a data output buffer 100 is a stand-by operation, a data output enable signal OE is inputted to NAND gates G2 and G3 with a "Low " potential level. Accordingly, an output of the NAND gate G2(a node N1) is maintained at a "HIGH " potential level. A transistor Q8 is activated in response to the "HIGH " potential level, thereby causing a node N5 to maintain into a "Low " potential level. A pull-up transistor Q11 is turned off since the "Low " potential level of the node N5 is inverted to a "HIGH " potential level by an inverter G12. The output of the NAND gate G3(a node N3) is maintained at a "HIGH " potential level. A pull-down transistor Q12 is turned off since the "HIGH " potential level of the node N3 is inverted to a "Low " potential level by an inverter G10. As a result, the output terminal Dout developes a high impedance.

If data having a "Low " potential level is output to the output terminal Dout, an input signal DO outputting from a sense amplifier(not shown in FIG. 2) will be a "Low " potential level and the data output enable signal OE will be a "HIGH " potential level. The output of the NAND gate G2 is maintained at a "HIGH " potential level, while the output of the NAND gate G3 is maintained at a "Low " potential level since the input signal DO is inverted by an inverter G1. The output of the NAND gate G3 is inverted by the inverter G10, thereby activating the pull-down transistor Q12. Accordingly, an output terminal Dout is maintained at a "Low " potential level. At this time, a voltage regulator 2 is not operated since a transistor Q19 is turned off by the output of the inverter G4 which is maintained at a "Low" potential level. The voltage regulator 2 is comprised of a differential amplifier having transistors Q14, Q15, Q17, Q18 and Q19; a transistor Q13 connected in parallel with a pull-up transistor Q11 and controlled by the output of the differential amplifier and the transistor Q16. When the potential level of the node N2 reaches a "Low" potential level, the transistor Q16 is turned on, while the transistor Q13 is turned off. Therefore, the output terminal Dour is maintained at a "Low" potential level.

If data having a "HIGH" potential level is output to the output terminal Dour, the input signal Do which is output from a sense amplifier will be a "HIGH" potential level and the data output enable signal OE will be of a "HIGH" potential level. If the node N3 changes to a "HIGH" potential level, the pull-down transistor Q12 turned off. If the node N1 changes to a "Low" potential level, a transistor Q8 turned off. The transistor Q10 and the transistor Q19 of the voltage regulator 2 are turned on by a "HIGH" potential level of the node N2, thereby operating the voltage regulator 2. Simultaneously, a node N7 is maintained at a "Low" potential level when the output of the inverter G4 is inverted by a delay circuit 3 having inverters G5, G6, G7, G8 and G9. That is, a node N7 is maintained at a "HIGH" potential level during a gate delay time of the inverters G5, G6, G7, G8 and G9.

The transistor Q9 is turned on by the "HIGH" potential level of the node N7 A node N6 is maintained at a "LOW" potential level since the transistor Q9 and Q10 are turned on. A node N8 is maintained at a "LOW" potential level by operation of inverters G11 and G12, thereby turning on a pull-up transistor Q11. Therefore, the potential level of the output terminal Dour is gradually increased by the activation of the pull-up transistor Q11 and the transistor Q13 of the voltage regulator 2. At this time, a transistor Q5 of a voltage comparator 1 is turned on by a "HIGH" potential level of a node N5, thereby activating the voltage comparator 1. The voltage comparator 1 is comprised of: a differential amplifier having transistors Q1, Q2, Q3, Q4 and Q5; a transistor Q6 connected between a voltage supply source $V_{DD}$ and the node N6 and controlled by the output of the differential amplifier; and a current source I connected between the node N6 and the ground. After the delay time of the delay circuit 3 is passed, the node N7 changes to a "LOW" potential level and thereby turning off the transistor Q9. Thereby the node N6 is maintained at the output potential level of the voltage comparator 1 by the operation of the transistor Q7 and the current source I.

For example, if the reference voltage Vref from a reference voltage generator 4 is identical in magnitude to output voltage $V_{OH}$ from the output terminal Dour, the output Voltage OUT1 of the differential amplifier is maintained at a "LOW" potential level. Accordingly, the transistor Q6 is turned on, thereby changing the node N6 to a "HIGH" potential level. Also, the node N5 is maintained at a "Low" potential level, thereby disabling the voltage comparator 1. Furthermore, the pull-up transistor Q11 is turned off, thereby maintaining the data output terminal Dour at the same voltage as that of the reference voltage generator 4.

Figure 2:
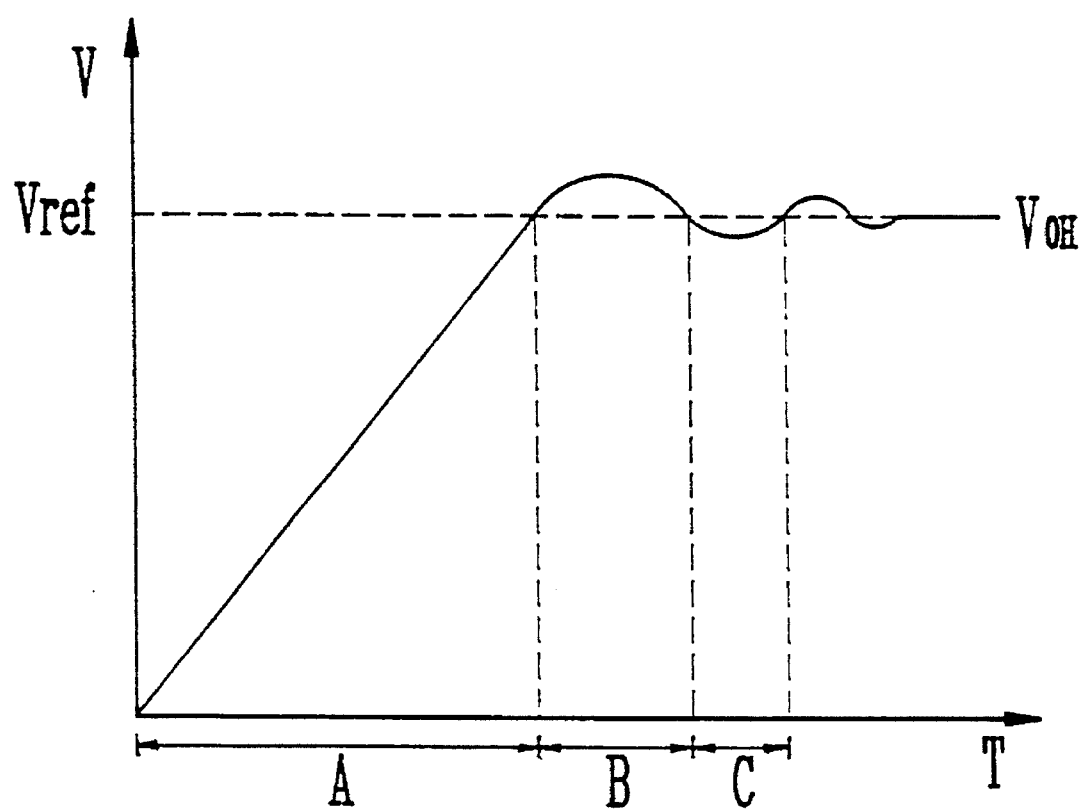
FIG. 2 is a voltage wave form to explain FIG. 1.

Changes in the output voltage, $V_{OH}$, occurring at the output terminal Dour are described with reference to FIG. 2.

When the output voltage $V_{OH}$ is less than the reference voltage Vref from the reference voltage generator 4(that is, $V_{OH} <$ Vref; an interval A shown in FIG. 2), the output voltage $V_{OH}$ is increased by the pull-up transistor Q11 and the transistor Q13 of the voltage regulator 2. After the gate delay time is passed, if the output voltage $V_{OH}$ is greater than the reference voltage Vref(that is, $V_{OH} >$ Vref; an interval B shown in FIG. 2), the potential level of the node N6 is maintained at a "HIGH" state by operation of a latch back transistor Q7, thereby turning off the pull-up transistor Q11 and the transistor Q13. As shown in FIG. 2, if the output voltage $V_{OH}$ is less than the reference voltage Vref again at interval C, the output voltage $V_{OH}$ increases due to the activation of the transistor Q13 again. Accordingly, the output voltage $V_{OH}$ through the output terminal Dout is maintained at a level equal to the reference voltage Vref.

As described the above, according to the present invention, noise generated in a power line is decreased when an output data is inverted, by equalizing the output voltage of the output buffer to a reference voltage regardless of variation in the operating voltage of the output buffer.

What is claimed is:

1. A data output buffer in a semiconductor device, comprising:

a latch circuit outputting a first, second and third latch signal in response to an output enable signal and an input signal;

a pull-down transistor activated by said third latch signal of said latch circuit;

a delay circuit to delay said second latch signal of said latch circuit;

a first switching circuit switched on in response to an output signal of said delay circuit;

a second switching circuit connected to said first switching circuit and switched on in response to said second latch signal of said latch circuit;

a control circuit activated by said first latch signal and the operation of said first and second switching circuits;

a reference voltage generator for generating a constant reference voltage;

a voltage comparator activated by an output signal of said control circuit and for comparing the output voltage of a data output buffer with the output voltage of said reference voltage generator, thereby outputting a compared signal to said control circuit;

a pull-up transistor activated in response to another output signal of said control circuit and connected to said pull-down transistor via an output terminal; and a voltage regulator activated by said second latch signal of said latch circuit and connected to said output terminal, and said reference voltage generator.

2. The data output buffer of claim 1, wherein said voltage comparator comprises:

a differential amplifier connected between a voltage supply source and the ground;

a transistor connected to said voltage source and activated by the operation of said differential amplifier; and a current source connected between said transistor and the ground.

3. The data output buffer of claim 1, wherein said delay circuit comprises a plurality of inverters.

4. The data output buffer of claim 1, wherein said voltage regulator comprises:

a differential amplifier connected between a voltage supply source and the ground;

a transistor connected between an output terminal of said differential amplifier and said voltage supply source; and a transistor connected between said voltage supply source and said data output terminal, with said transistor activating in response to the output voltage of said differential amplifier.

5. The data output buffer of claim 1, wherein said control circuit comprises;

a first transistor connected between said voltage comparator and the ground, with said first transistor activating in response to said second latch signal;

a second transistor connected between a supply voltage source and said first switching circuit, with said second transistor activating by the operation of said first transistor;

a first inverter connected between said first switching circuit and said first transistor; and a second inverter connected between said first inverter and said pull-up transistor.

* * * * *